(12) United States Patent
Baldasseroni et al.

(10) Patent No.: US 9,698,042 B1
(45) Date of Patent: Jul. 4, 2017

(54) WAFER CENTERING IN POCKET TO IMPROVE AZIMUTHAL THICKNESS UNIFORMITY AT WAFER EDGE

(71) Applicant: LAM RESEARCH CORPORATION, Fremont, CA (US)

(72) Inventors: Chloe Baldasseroni, Portland, OR (US); Ted Minshall, Sherwood, OR (US); Frank L. Pasquale, Beaverton, OR (US); Shankar Swaminathan, Beaverton, OR (US); Ramesh Chandrasekharan, Portland, OR (US)

(73) Assignee: LAM RESEARCH CORPORATION, Fremont, CA (US)

( * ) Notice: Subject to any disclaimer, the term of this patent is extended or adjusted under 35 U.S.C. 154(b) by 0 days.

(21) Appl. No.: 15/217,345

(22) Filed: Jul. 22, 2016

(51) Int. Cl.
| | | |
|---|---|---|
| *H01L 21/687* | (2006.01) |
| *H01L 21/02* | (2006.01) |
| *C23C 16/455* | (2006.01) |
| *C23C 16/50* | (2006.01) |

(52) U.S. Cl.
CPC .... *H01L 21/6875* (2013.01); *C23C 16/45525* (2013.01); *C23C 16/50* (2013.01); *H01L 21/0228* (2013.01); *H01L 21/68735* (2013.01); *H01L 21/68742* (2013.01)

(58) Field of Classification Search
CPC ............... H01L 21/68; H01L 21/68764; H01L 21/68785; H01L 21/702; H01L 21/705; H01L 21/707; H01L 21/6875; H01L 21/0228; H01L 21/68735; H01L 21/68742; C23C 16/45525; C23C 16/50; B05B 15/10; B05B 11/1015; B05C 1/0878; B65G 49/05

USPC ..... 438/778; 118/729, 681, 708; 414/222.01
See application file for complete search history.

(56) References Cited

U.S. PATENT DOCUMENTS

| | | |
|---|---|---|
| 3,603,646 A | 9/1971 | Leoff |
| 3,930,684 A | 1/1976 | Lasch, Jr. et al. |
| 4,024,944 A | 5/1977 | Adams et al. |
| 4,618,292 A | 10/1986 | Judge et al. |
| 4,659,094 A | 4/1987 | Leonov |
| 4,874,273 A | 10/1989 | Tokisue et al. |
| 5,108,513 A | 4/1992 | Muller et al. |
| 5,920,797 A * | 7/1999 | Ballance ........... H01L 21/67115 438/758 |
| 6,032,512 A | 3/2000 | Li |

(Continued)

FOREIGN PATENT DOCUMENTS

WO 9744816 A1 11/1997

*Primary Examiner* — Yasser A Abdelaziez
(74) *Attorney, Agent, or Firm* — Buchanan Ingersoll & Rooney PC

(57) ABSTRACT

A method for reducing slippage of a wafer during film deposition includes pumping out a processing chamber while the wafer is supported on lift pins or a carrier ring and lowering the wafer onto support members configured to minimize wafer slippage during deposition of the film. A multi-station processing chamber, such as a processing chamber for atomic layer deposition, can include a chuckless pedestal at each station having wafer supports configured to prevent the wafer from moving off center by more than 400 microns. To minimize a gas cushion beneath the wafer, the wafer supports can provide a gap of at least 2 mils between the back side of the wafer and the wafer-facing surface of the pedestal.

19 Claims, 12 Drawing Sheets

(56) References Cited

U.S. PATENT DOCUMENTS

| | | |
|---|---|---|
| 6,075,924 A | 6/2000 | Will |
| 6,126,382 A | 10/2000 | Scales et al. |
| 6,361,268 B1 | 3/2002 | Pelrine et al. |
| 6,427,991 B1 | 8/2002 | Kao |
| 6,760,976 B1 | 7/2004 | Martinson et al. |
| 6,893,507 B2 | 5/2005 | Goodman et al. |
| 7,052,229 B2 | 5/2006 | Berger et al. |
| 7,070,833 B2 | 7/2006 | Smith et al. |
| 7,513,716 B2 | 4/2009 | Hayashi et al. |
| 8,033,771 B1 * | 10/2011 | Gage ............... H01L 21/67109 414/217 |
| 8,454,294 B2 | 6/2013 | Gage et al. |
| 8,851,463 B2 | 10/2014 | Angelov et al. |
| 8,954,287 B2 | 2/2015 | Rodnick et al. |
| 9,082,802 B2 | 7/2015 | Yang |
| 9,184,084 B2 | 11/2015 | Rodnick |
| 9,214,375 B2 | 12/2015 | Rodnick et al. |
| 9,275,868 B2 | 3/2016 | Adderly et al. |
| 9,299,598 B2 | 3/2016 | Blank |
| 2002/0007791 A1 * | 1/2002 | Horiguchi ......... H01L 21/67017 118/715 |
| 2003/0089395 A1 | 5/2003 | Erdei et al. |
| 2006/0137609 A1 | 6/2006 | Puchacz et al. |
| 2006/0156979 A1 | 7/2006 | Thakur et al. |
| 2007/0281447 A1 * | 12/2007 | Lee ................... C23C 16/4586 438/478 |
| 2011/0318142 A1 | 12/2011 | Gage et al. |
| 2013/0269609 A1 | 10/2013 | Leeser |
| 2014/0076234 A1 | 3/2014 | Kao et al. |
| 2015/0107513 A1 | 4/2015 | Swaminathan et al. |
| 2015/0332912 A1 | 11/2015 | Nowak et al. |
| 2015/0357161 A1 | 12/2015 | Augustyniak et al. |
| 2016/0035566 A1 | 2/2016 | LaVoie et al. |
| 2016/0163539 A9 | 6/2016 | Kang et al. |
| 2016/0172165 A1 | 6/2016 | Jeon et al. |
| 2016/0177443 A1 | 6/2016 | Kumar et al. |
| 2016/0177444 A1 | 6/2016 | Baldasseroni et al. |

\* cited by examiner

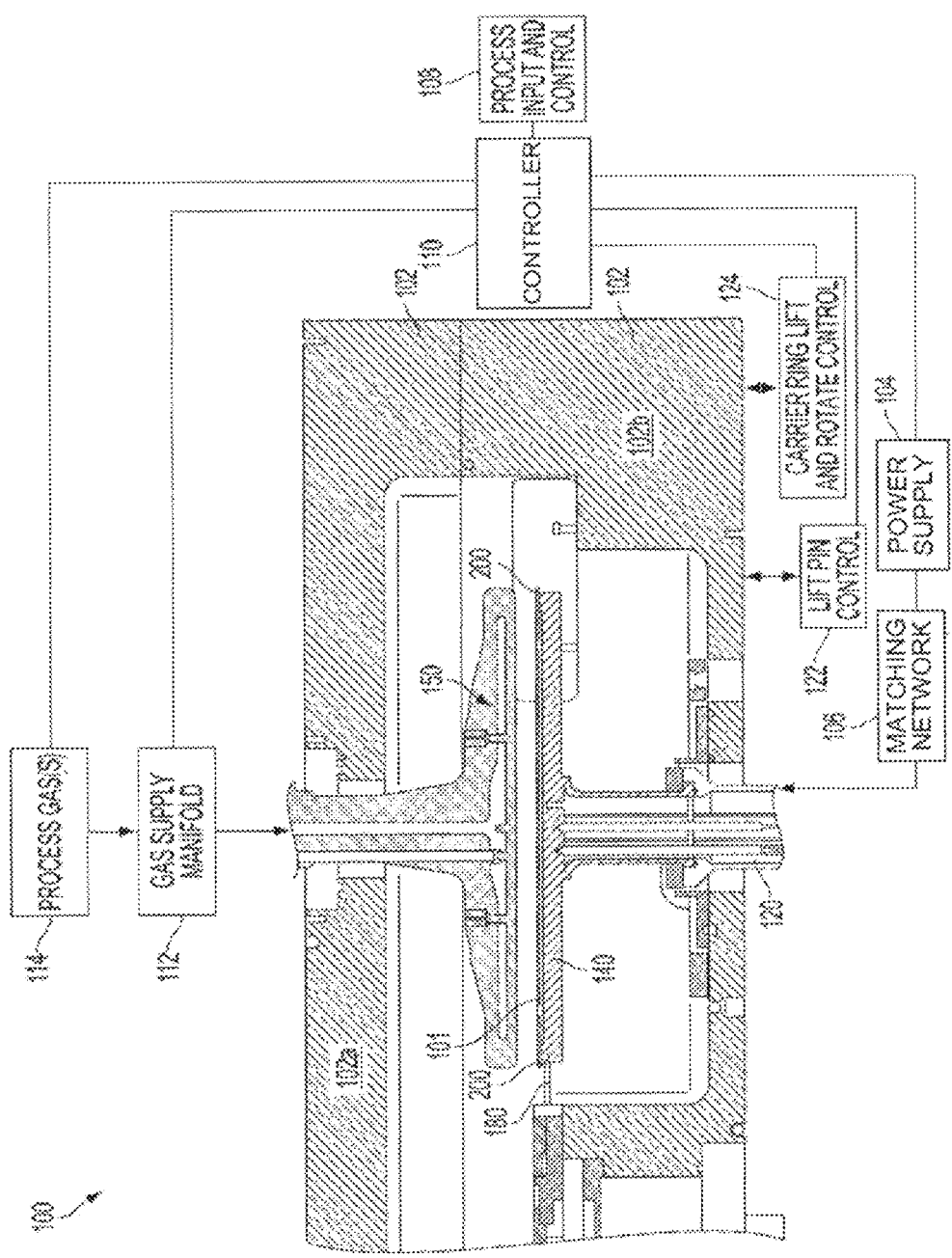

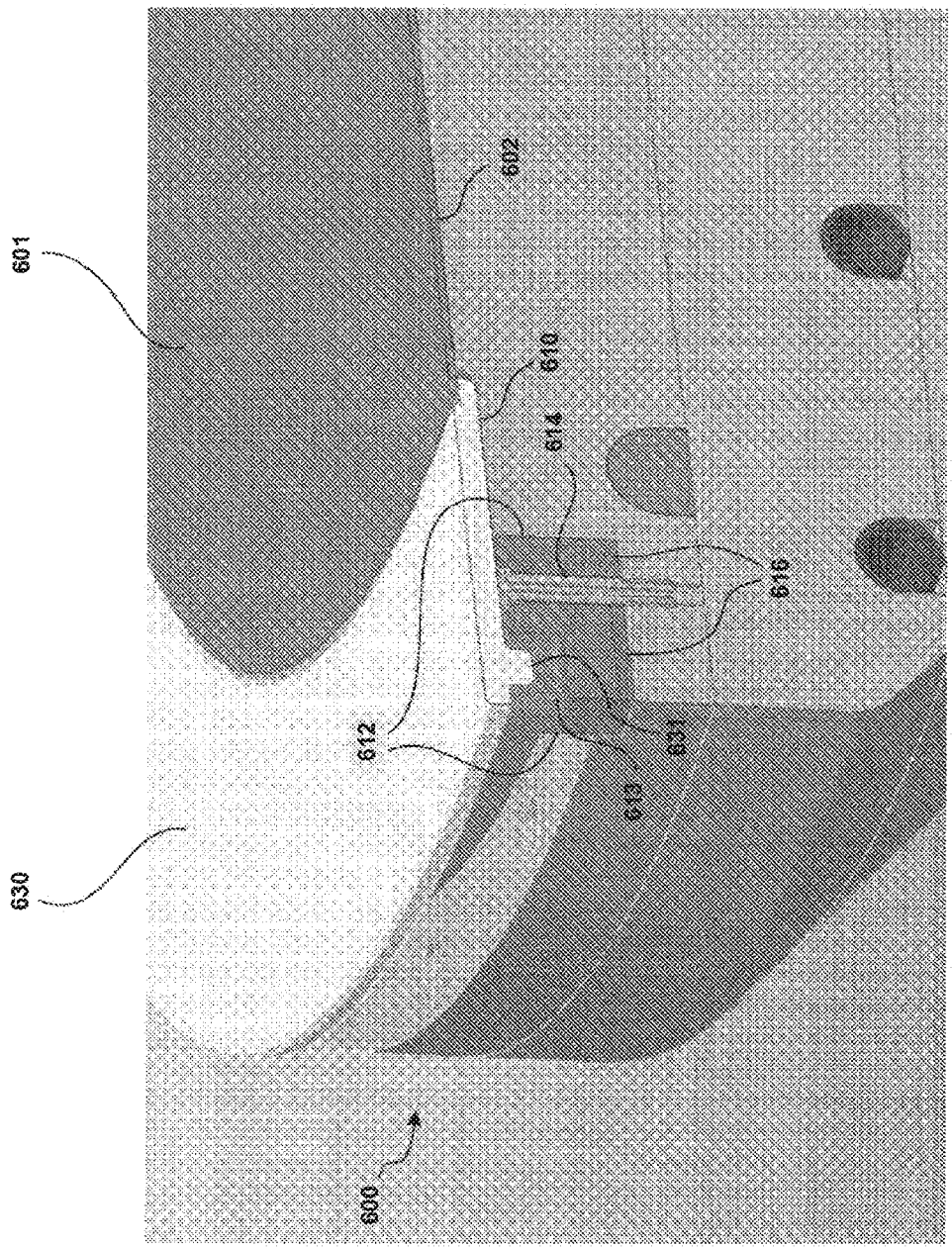

WAFER CENTERING IN POCKET TO IMPROVE AZIMUTHAL THICKNESS UNIFORMITY AT WAFER EDGE

FIELD OF THE INVENTION

This disclosure generally relates to a method of improving uniformity of a deposited film on a wafer supported on a chuck-less pedestal in a semiconductor processing tool. Certain aspects of this disclosure pertain to preventing wafer slippage during deposition of the film on the wafer.

BACKGROUND

During deposition in a processing chamber, a film can be deposited on a frontside of the wafer. For example, in atomic layer deposition (ALD), a film can be deposited layer by layer by successive dosing and activation steps. In ALD processing chambers, precursor gases can be directed to a wafer and the precursor gases can chemisorb onto a surface of the wafer to form a monolayer. Additional precursor gases can be introduced that react with the monolayer, and a purge gas can be subsequently introduced to remove excess precursors and gaseous reaction by-products. Precursor gases can be alternately pulsed without overlap, and cycles can be repeated as many times as desired to form a film of suitable thickness.

However, when the wafer is held by a chuck-less method, wafer slippage can occur and lead to non-uniform thickness of the deposited film at a wafer edge. For example, during the deposition process, the wafer can be supported on wafer supports which provide a gap between the wafer and the pedestal upper surface and a gas cushion in the gap can lead to wafer movement (slippage) such that the wafer moves closer to one edge of a pocket in which the wafer is located. If the wafer is not centered in the pocket, the film thickness can be non-uniform at the water edge.

Accordingly, it would be desirable to provide a solution to the problem of wafer slippage during film deposition in order to improve azimuthal thickness uniformity at the wafer edge.

SUMMARY

Disclosed herein is a method for processing a semiconductor substrate (wafer), wherein the method includes supporting the water above a wafer-facing surface of a chuck-less pedestal in a processing chamber, pumping out the processing chamber to a reduced pressure effective to reduce slippage of the wafer when placed on wafer supports extending from the water-facing surface of the pedestal, lowering the wafer onto the wafer supports while the processing chamber is at the reduced pressure and supporting the wafer a sufficient distance above the wafer-facing surface of the chuck-less pedestal to reduce slippage during film deposition on the wafer, and depositing a film on the wafer while supported on the wafer supports, wherein slippage of the wafer off center from its initial position is less than 400 microns after the film is deposited.

In an embodiment, the processing chamber includes at least first, second, third and fourth stations, the first station having a first chuck-less pedestal and a first carrier ring at an outer periphery thereof supporting a first wafer, the second station having a second chuck-less pedestal and a second carrier ring at an outer periphery thereof supporting a second wafer, the third station having a third chuck-less pedestal and third carrier ring at an outer periphery thereof, and the fourth station having a fourth chuck-less pedestal and carrier ring at an outer periphery thereof, the method further comprising simultaneously lifting the first, second, third and fourth carrier rings at the first, second, third and fourth stations, indexing the first, second, third and fourth carrier rings such that the first and second wafers on the first and second carrier rings are moved to the third and fourth stations, pumping out the processing chamber to a pressure effective to reduce slippage of the first and second wafers when placed on wafer supports extending from wafer-facing surfaces of the third and fourth chuck-less pedestals, lowering the first and second wafers onto the wafer supports of the third and fourth chuck-less pedestals while the processing chamber is at the reduced pressure. The method can further include transferring third and fourth wafers into the processing chamber at the first and second stations, supporting the third and fourth wafers on raised lift pins at the first and second stations, pumping out the processing chamber to a pressure effective to reduce slippage of the third and fourth wafers when placed on the wafer supports at the first and second stations, lowering the lift pins at the first and second stations so as to support the third and fourth wafers on the wafer supports of the first and second chuck-less pedestals while the processing chamber is at the reduced pressure.

In some implementations, the method includes flowing gas onto a frontside of the wafer while pressure in the processing chamber is lowered to the reduced pressure. Preferably, the wafer supports comprise at least three minimum contact area (MCA) support members extending at least 2 mils above the wafer-facing surface; at least 4 mils above the wafer-facing surface, or at least 6 mils above the wafer-facing surface.

In some implementations, the wafer is supported on lift pins while the pressure in the processing chamber is lowered to the reduced pressure, the wafer is lowered onto the wafer supports by lowering the lift pins while maintaining the processing chamber at the reduced pressure.

In some implementations, the wafer is supported on a carrier ring while the pressure in the processing chamber is lowered to the reduced pressure.

In some implementations, the reduced pressure is 0.5 Torr or below, 0.2 Torr or below, or 0.1 Torr or below.

In some implementations, the film deposition comprises atomic layer deposition (ALD) on a frontside of the wafer. By reducing slippage of the wafer, non-uniformity of film thickness at a distance of 1.8 mm from an outer edge of the water can be about 0.5% or below and/or the film thickness variation at a distance of 1.5 mm from an outer edge of the wafer can be below 5 Angstroms.

In some implementations, the film deposition can be carried out in a single station of the processing chamber or the film deposition can be carried out sequentially in four stations of the processing chamber.

BRIEF DESCRIPTION OF THE DRAWINGS

FIG. 1A shows a cross-sectional schematic of an example apparatus for processing a wafer.

FIG. 6A shows a perspective cutaway view of a portion of an example pedestal with a carrier ring.

FIGS. 8A-8B show depictions of AWC data comparing two wafer placement processes for stations 1-4 of a four station deposition chamber wherein FIG. 8A shows data for a standard wafer placement process in which the waters are lowered onto MCAs having heights of 2 mils and chamber pressure is at 0.5 Torr and FIG. 8B shows data for a low pressure wafer placement process in which the wafers are lowered onto MCAs having a height of 4 mils and the pump-to-base chamber pressure of <0.01 Torr when the wafers are placed on the wafer supports.

DETAILED DESCRIPTION

Figure 1B:
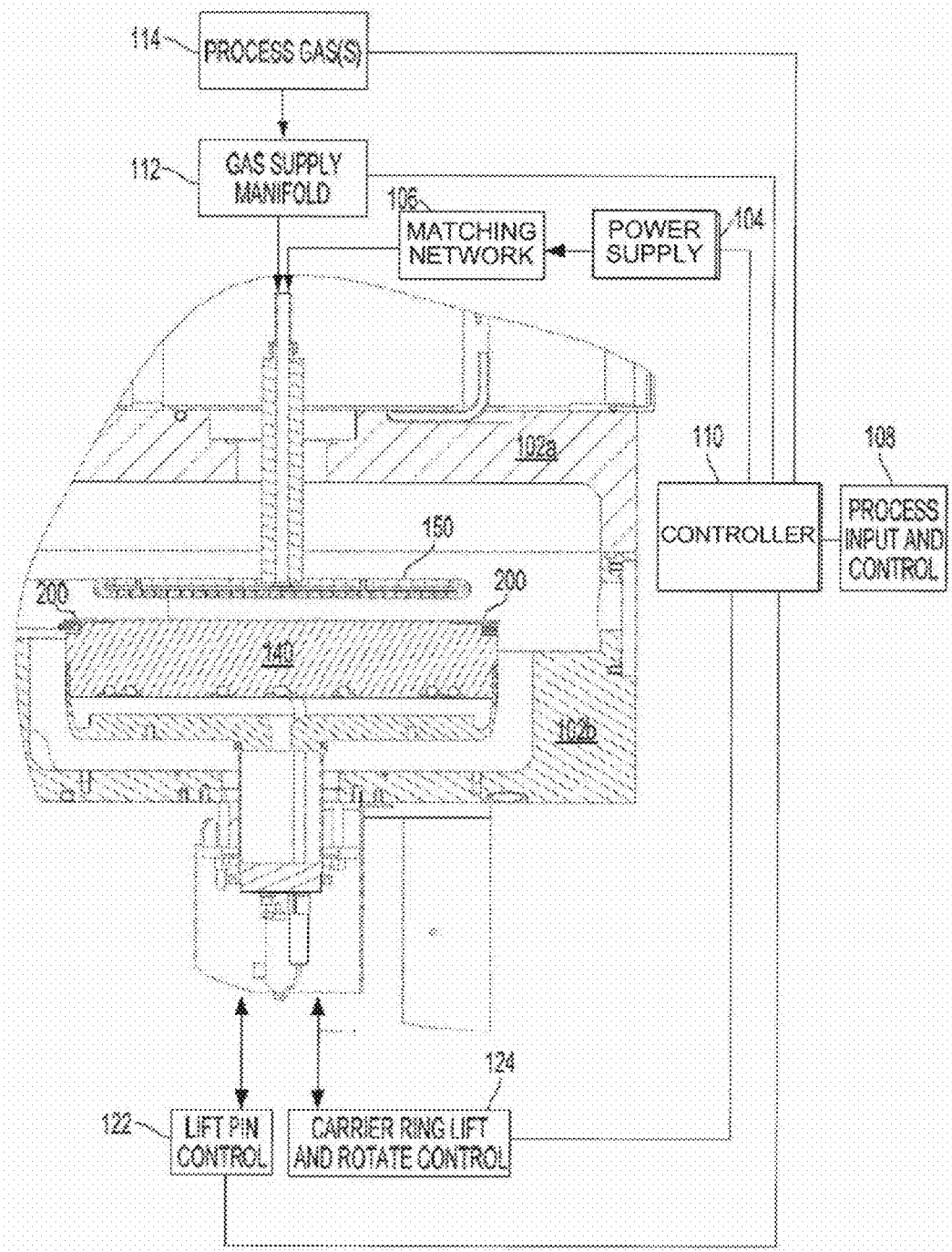
FIG. 1B shows a magnified view of a cross-sectional schematic of an example apparatus for processing a wafer.

In the following description, numerous specific details are set forth in order to provide a thorough understanding of the presented concepts. The presented concepts may be practiced without some or all of these specific details. In other instances, well known process operations have not been described in detail so as to not unnecessarily obscure the described concepts. While some concepts will be described in conjunction with the specific embodiments, it will be understood that these embodiments are not intended to be limiting.

Introduction

In this application, the terms "semiconductor wafer," "wafer," "substrate," "wafer substrate," and "partially fabricated integrated circuit" are used interchangeably. One of ordinary skill in the art would understand that the term "partially fabricated integrated circuit" can refer to a silicon wafer during any of many stages of integrated circuit fabrication thereon. A wafer or substrate used in the semiconductor device industry typically has a diameter of 200 mm, or 300 mm, or 450 mm. The following detailed description assumes the invention is implemented on a wafer. However, the invention is not so limited. The work piece may be of various shapes, sizes, and materials. In addition to semiconductor wafers, other work pieces that may take advantage of this invention include various articles such as printed circuit boards, magnetic recording media, magnetic recording sensors, mirrors, optical elements, micro-mechanical devices and the like.

FIG. 1A shows a cross-sectional schematic of an example apparatus for processing a wafer. The apparatus 100 can be used to process a wafer 101. The apparatus 100 can include a processing chamber 102 having an upper chamber portion 102a and a lower chamber portion 102b. The apparatus 100 can also include a pedestal 140 configured to support the wafer 101. In some implementations, the pedestal 140 can serve as a powered electrode. In some implementations, the pedestal 140 can be electrically coupled to a power supply 104 via a matching network 106. The power supply 104 can be controlled by a controller 110, where the controller 110 can be configured with various instructions for executing operations for the apparatus 100. The controller 110 can be configured with instructions for executing process input and control 108, which can include process recipes, such as power levels, timing parameters, deposition parameters, process gases, movement of the wafer 101, etc.

In some implementations, the apparatus 100 can include lift pins 120, which can be controlled by lift pin control 122. The lift pins 120 can be used to raise the wafer 101 from the pedestal 140 to allow for a wafer handling system (e.g., end-effector) to transport the wafer 101 to and from the pedestal 140.

In some implementations, the apparatus 100 can include a gas supply manifold 112 configured to receive process gases 114. In some implementations, the controller 110 can control the delivery of the process gases 114 via the gas supply manifold 112. Selected process gases 114 can be delivered into a showerhead 150, and the showerhead 150 can distribute the selected process gases 114 towards the wafer 101 being supported over the pedestal 140. It will be appreciated that showerhead 150 may have any suitable shape, and may have any suitable number and arrangement of ports for distributing the process gases 114 to the wafer 101.

Also shown is a carrier ring 200 that surrounds an outer region of the pedestal 140. The carrier ring 200 can be configured to support the wafer 101 during transport of the wafer 101 to and from the pedestal 140. The carrier ring 200 can include an annular body positioned around the outer region of the pedestal 140. One or more contact structures 180 (e.g., spider forks) can be configured to be lift the wafer 101 with the carrier ring 200. The carrier ring 200 can be lifted along with the wafer 101 so that the water 101 can be transported to another station, such as another station in a multi-station processing tool.

In some implementations, the processing chamber 102 of the apparatus 100 can be configured to deposit film on the wafer 101. In some implementations, the processing chamber 102 can be a capacitively coupled plasma processing chamber. For example, the processing chamber 102 can be configured to deposit the film by PECVD or ALD.

FIG. 1B shows a magnified view of a cross-sectional schematic of an example apparatus for processing a wafer. The apparatus 100 can be configured to deposit film on the wafer 101 by ALD. The film can include ALD oxide. Similarly components of the apparatus 100 are described with reference to FIG. 1A. However, in some implementations, the power supply 140 can be supplied to the showerhead 150 as shown in FIG. 1B.

In some implementations, the apparatus 100 can further include one or more wafer supports (not shown) configured to extend from the pedestal 140 to support the wafer 101 above a wafer-facing surface of the pedestal 140. The one or more wafer supports are discussed with reference to FIGS. 3-5 below.

Figure 2:
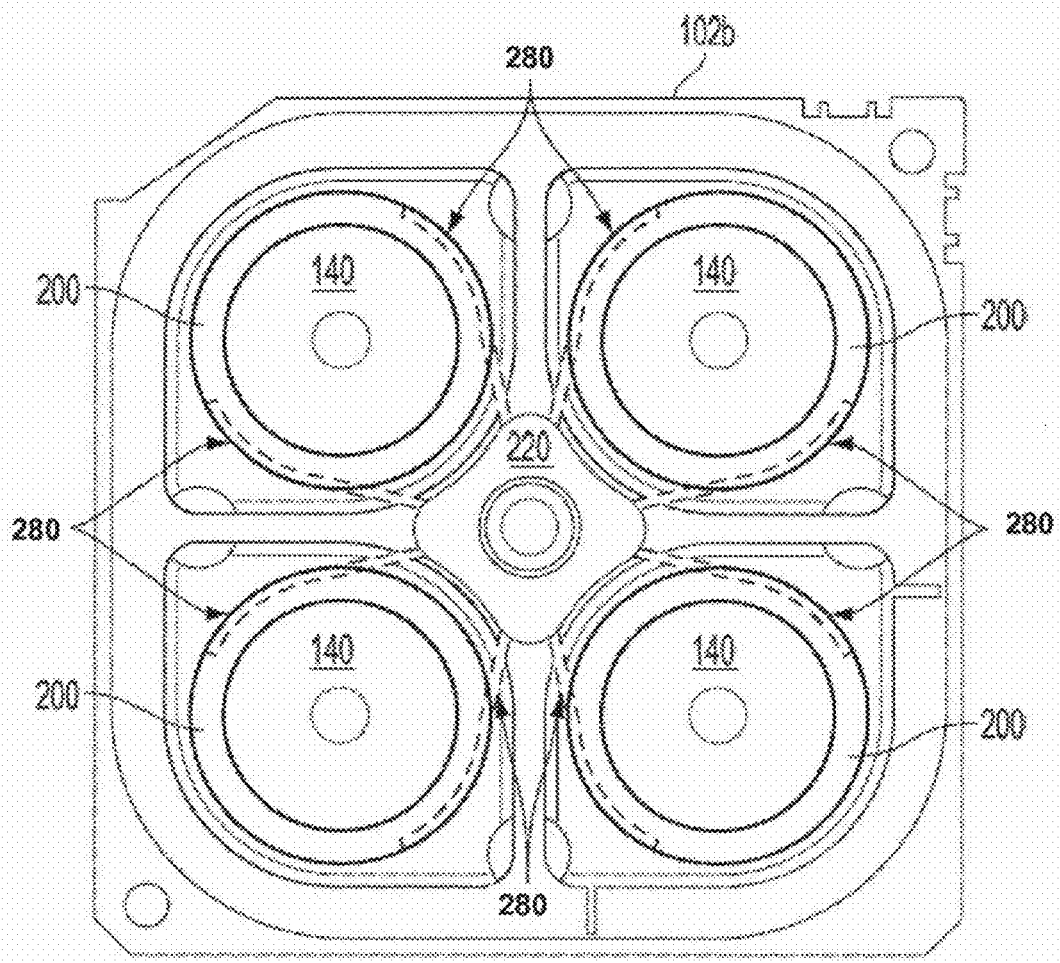
FIG. 2 shows a top view of a schematic diagram of an example multi-station processing tool.

FIG. 2 shows a top view of a schematic diagram of an example multi-station processing tool. The multi-station processing tool can include four processing stations. The top view is of the lower chamber portion 102b, with the top chamber portion 102a removed for illustration. The four processing stations can be accessed by spider forks 280. Each spider fork 280 includes a first and a second arm, each of which is positioned around a portion of each side of the pedestal 140. The spider forks 280 use an engagement and rotation mechanism 220 that can raise and lift the carrier rings 200, such as from the lower surface of the carrier rings 200, where each of the carrier rings 200 can support a wafer. This action of raising the carrier rings 200 can be performed from the processing stations simultaneously, and then a mechanism 220 is rotated before lowering the carrier rings 200 to a next one of the at least one or more processing stations so that further processing can take place on respective wafers.

Figure 3:
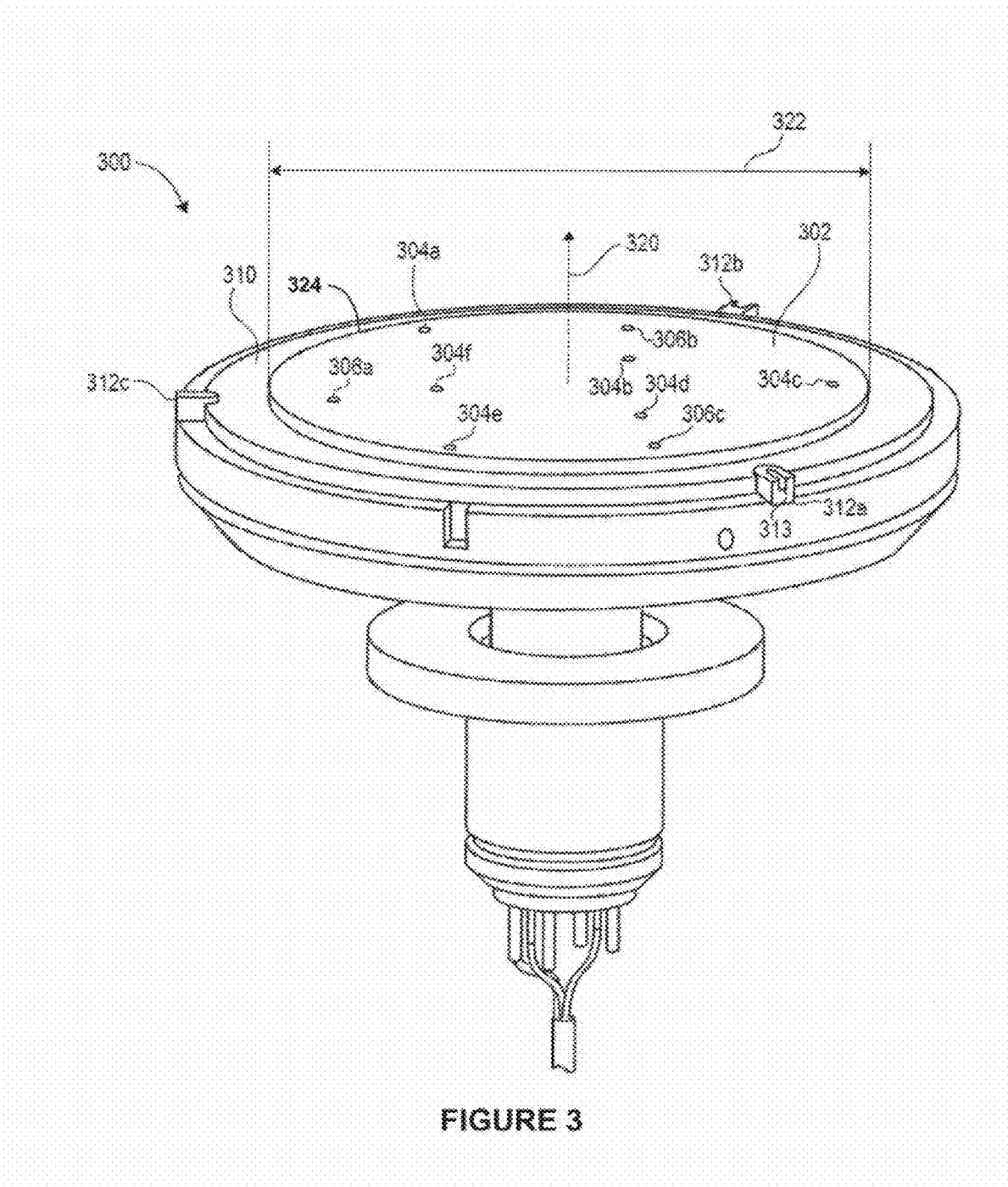
FIG. 3 shows a perspective view of an example pedestal with a plurality of wafer supports configured to extend from the pedestal, including outer and inner wafer supports.

FIG. 3 shows a perspective view of an example pedestal with a plurality of wafer supports configured to extend from the pedestal, including outer and inner wafer supports. The pedestal 300 as shown in FIG. 3 can be incorporated in the apparatus 100 in FIGS. 1A and 1B, where the pedestal 300 can be configured to receive a wafer (not shown) for a deposition process, such as ALD. The pedestal 300 includes a wafer-facing surface 302 extending from a central axis 320 to an outer edge 324. The wafer-facing surface 302 can be a circular area defined by a diameter 322. The wafer-facing surface 302 can be referred to as a mesa or a central top surface of the pedestal 300.

A plurality of wafer supports 304a, 304b, 304c, 304d, 304e, and 304f can extend from the pedestal 300 and configured to support a wafer at a level above the wafer-facing surface 302. Wafer supports 304a, 304c, and 304e can constitute outer wafer supports and wafer supports 304b, 304d, and 304f can constitute inner wafer supports. The level above the wafer-facing surface 302 can be defined by the vertical position of a backside of a wafer when supported by the wafer supports 304a, 304b, 304c, 304d, 304e, and 304f from the wafer-facing surface 302. In FIG. 3, the plurality of wafer supports 304a, 304b, 304c, 304d, 304e, and 304f includes six wafer supports, but any number of wafer supports may be distributed for supporting the wafer, such as any number between about 3 and 30 wafer supports.

In some implementations, the pedestal 300 can include the plurality of wafer supports 304a, 304b, 304c, 304d, 304e, and 304f. The water supports 304a, 304b, 304c, 304d, 304e, and 304f can be referred to as minimum contact area (MCA) supports for maintaining a small gap between the pedestal 300 and the backside of the wafer. MCA supports may be used to improve precision mating between surfaces when high precision or tolerances are required, and/or minimal physical contact is desired to reduce defect risk. The wafer supports 304a, 304b, 304c, 304d, 304e, and 304f may be standalone components, such as sapphire balls or pins positioned within recesses of the pedestal 300, or integrated into the pedestal 300. The wafer supports 304a, 304b, 304c, 304d, 304e, and 304f can be made of any suitable insulating material, such as a dielectric material. The height of the wafer supports 304a, 304b, 304c, 304d, 304e, and 304f may be adjustable so that the gap size may be controlled to control slippage of the wafer during film deposition. In some implementations, the height can be between about 0.002 inch (2 mils) and about 0.010 inch (10 mils), between about 2 mils and about 7 mils, or about 4 mils above the wafer-facing surface 302 of the pedestal 300.

While a small gap may be desired between the wafer and the pedestal 300 to normalize impedance, during wafer placement on the wafer supports, a gas cushion beneath the wafer can lead to movement (slippage) of the wafer away from the center of the pedestal. However, if the wafer supports 304a, 304b, 304c, 304d, 304e, and 304f provide a sufficient gap between the wafer and the pedestal 300, the effect of a gas cushion beneath the wafer can be reduced. To further reduce the possibility of wafer slippage during wafer placement, the chamber pressure can be reduced prior to wafer placement thereby minimizing or eliminating the gas cushion beneath the wafer as it is placed on the wafer supports. By providing the wafer supports with a sufficient height, wafer slippage can be reduced during deposition of a film on the wafer and thereby provide better uniformity in film thickness at the outer edge of the wafer.

The pedestal 300 can include a plurality of recesses 306a, 306b, and 306c that are configured to house lift pins. As noted above, the lift pins can be utilized to raise the wafer from the wafer supports 304a, 304b, 304c, 304d, 304e, and 304f to allow for engagement by a wafer handling system (e.g., end-effector). During a wafer placement process, a wafer can be supported on the lift pins while the chamber pressure is reduced and the lift pins lowered to place the wafer on the wafer supports while the chamber pressure is reduced.

Adjacent to the outer edge 324 of the wafer-facing surface 302, the pedestal 300 can further include an annular surface 310 extending around the peripheral region of the pedestal 300. The annular surface 310 can define the peripheral region of the pedestal 300 and surrounding the wafer-facing surface 302, but at a step down from the wafer-facing surface 302. That is, the vertical position of the annular surface 310 can be lower than the vertical position of the wafer-facing surface 302.

In some implementations, a plurality of carrier ring support structures 312a, 312b, and 312c can be positioned at an outer edge of the annular surface 310. The carrier ring support structures 312a, 312b, and 312c can be symmetrically arranged about the annular surface 310. The carrier ring support structures 312a, 312b, and 312c can serve as MCA supports for supporting a carrier ring. In some implementations, the carrier ring support structures 312a, 312b, and 312c can extend beyond the outer edge of the annular surface 310. In some implementations, the top surfaces of the carrier ring support structures 312a, 312b, and 312c can have a height that is higher than that of the annular surface 310, so that a carrier ring can be supported at a predefined distance above the annular surface 310. Each carrier ring support structure 312a, 312b, and 312c can include a recess 313 through which an extension protruding from the underside of the carrier side is seated when the carrier ring is supported on the carrier ring support structures 312a, 312b, and 312c. The mating of the extensions with the recesses 313 in the carrier ring support structures 312a, 312b, and 312c can provide for secure positioning of the carrier ring. While FIG. 3 illustrates three carrier ring support structures 312a, 312b, and 312c, any number of carrier ring support structures along the outer edge of the annular surface 310 and at any locations along the outer edge of the annular surface 310.

Typically, a pedestal with wafer supports hold a wafer so that the wafer is substantially parallel with the pedestal, or so that the wafer supports minimize wafer deflection or sag. The wafer supports 304a, 304b, 304c, 304d, 304e, and 304f in FIG. 3 are arranged to support the water above a substantially uniform gap maintained between the wafer and the wafer-facing surface 302. The wafer supports 304a, 304b, 304c, 304d, 304e, and 304f in FIG. 3 are arranged to support the wafer so that wafer deflection and sag is minimal. By way of example, the pedestal 300 in FIG. 3 can have six adjustable MCA supports 304a, 304b, 304c, 304d, 304e, and 304f, with three of the MCA supports 304b, 304d, and 304f uniformly arranged on a 5-inch bolt circle and three of the MCA supports 304a, 304c, and 304e uniformly arranged on a 10-inch bolt circle. The MCA supports 304b, 304d, and 304f can be arranged in a triangular pattern by 60 degrees, and the MCA supports 304a, 304c, and 304e can be arranged in a triangular pattern by 60 degrees.

Figure 4:
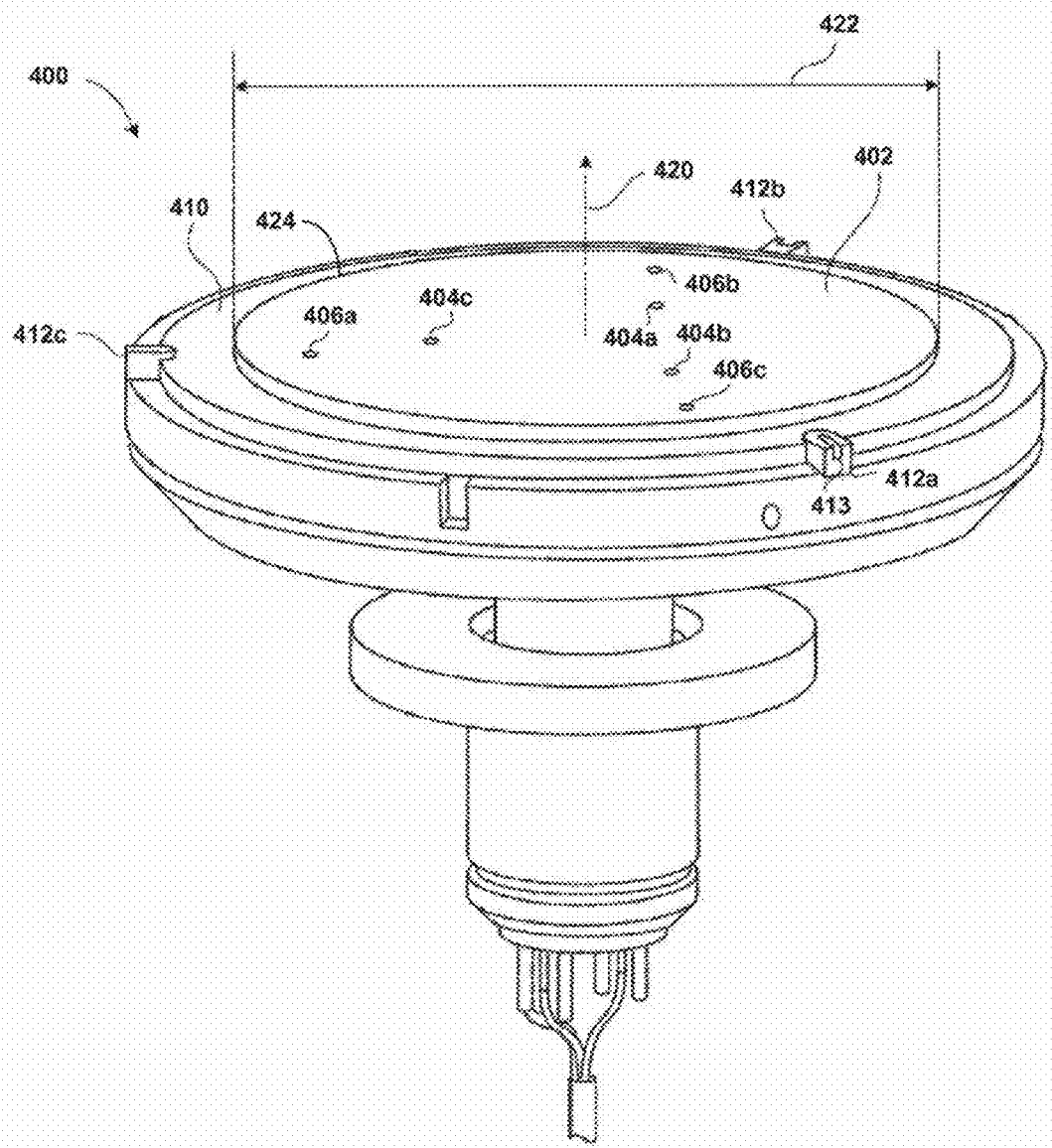
FIG. 4 shows a perspective view of an example pedestal with a plurality of wafer supports configured to extend from the pedestal, including inner wafer supports.

FIG. 4 shows a perspective view of an example pedestal with a plurality of wafer supports configured to extend from the pedestal, including inner wafer supports. The pedestal 400 as shown in FIG. 4 can be incorporated in the apparatus 100 in FIGS. 1A and 1B, where the pedestal 400 can be configured to receive a wafer for a deposition process, such as ALD. The pedestal 400 includes a wafer-facing surface 402 extending from a central axis 420 to an outer edge 424. The wafer-facing surface 402 can be a circular area defined by a diameter 422.

A plurality of wafer supports 404a, 404b, and 404c can extend from the pedestal 400 and configured to support a wafer at a level above the wafer-facing surface 402. The plurality of wafer supports 404a, 404b, and 404c in FIG. 4 can be incorporated in the apparatus 100 in FIGS. 1A and 1B. The wafer supports 404a, 404b, and 404c can be symmetrically arranged about the central axis 420 of the wafer-facing support 402. The level above the wafer-facing surface 402 can be defined by the vertical position of a backside of a wafer when supported by the wafer supports 404a, 404b, and 404c from the wafer-facing surface 402. In FIG. 4, the plurality of wafer supports 404a, 404b, and 404c include three wafer supports, but any number of wafer supports may be distributed for supporting the wafer, such as any number between about 3 and 30 wafer supports. The three or more wafer supports 404a, 404b, and 404c can constitute inner wafer supports.

In some implementations, the pedestal 400 can include the plurality of wafer supports 404a, 404b, and 404c. The wafer supports 404a, 404b, and 404c can be referred to as MCA supports for maintaining a small gap between the pedestal 400 and the backside of the wafer. MCA supports may be used to improve precision mating between surfaces when high precision or tolerances are required, and/or minimal physical contact is desired to reduce defect risk. The wafer supports 404a, 404b, and 404c may be standalone components, such as sapphire balls or pins positioned within recesses of the pedestal 400, or integrated into the pedestal 400. The wafer supports 404a, 404b, and 404c can be made of any suitable insulating material, such as a dielectric material. The height of the wafer supports 404a, 404b, and 404c may be adjustable so that the gap size may be controlled. In some implementations, the height can be between about 2 mils and about 10 mils, between about 2 mils and about 7 mils, or about 4 mils above the wafer-facing surface 402 of the pedestal 400. A gap is provided between the backside of the wafer and the pedestal 400, where the gap is sized to minimize slippage of the wafer during wafer placement and during film deposition on the wafer.

Additionally, the pedestal 400 can include a plurality of recesses 406a, 406b, and 406c that are configured to house lift pins. As noted above, the lift pins can be utilized to raise the wafer from the wafer supports 404a, 404b, and 404c to allow for engagement by a wafer handling system (e.g., end-effector). Details of an end effector with an integrated aligner can be found in commonly assigned U.S. Pat. No. 9,299,598, the disclosure of which is hereby incorporated by reference.

Figure 5:
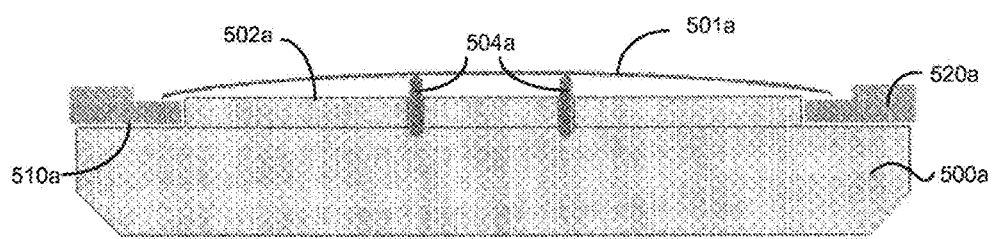
FIG. 5 shows a side view of a schematic diagram of wafer sag induced by inner wafer supports for an example pedestal with a carrier ring.

FIG. 5 shows a side view of a schematic diagram of wafer sag induced by inner wafer supports for an example pedestal with a carrier ring. In FIG. 5, the pedestal 500a can include a mesa or wafer-facing surface 502a that faces the backside of a wafer 501a. The pedestal 500a can also include an annular surface 510a that is located around the wafer-facing surface 502a and a step down from the wafer-facing surface 502a. The wafer 501a can include a central region and an outer edge, where the wafer 501a can be capable of sagging/deflecting at its outer edge. The outer edge of the wafer 501a can extend beyond the wafer-facing surface 502a and over the annular surface 510a. A carrier ring 520a surrounds an outer edge of the wafer-facing surface 502a. The carrier ring 520a can include an annular body positioned around the outer region of the pedestal 500a.

FIG. 6A shows a perspective cutaway view of a portion of an example pedestal with a carrier ring. A carrier ring 630 is shown resting atop a carrier ring support 612 over an annular surface 610. In some implementations, a carrier ring extension 631 is seated within a recess 613 of the carrier ring support 612. Also, a wafer 601 is shown resting over the wafer-facing surface 602 of the pedestal 600, where the wafer 601 is supported by wafer supports (not shown). The height of the carrier ring support 612 is adjustable, so as to allow the distance above the annular surface 610 of the pedestal 600 to be adjusted. In some implementations, the carrier ring support 612 includes a spacer 616 (e.g., a shim) for adjusting the height of at least one of the carrier ring supports 612. That is, the spacer 616 can be selected to provide for a controlled distance between the carrier ring 630 and the annular surface 610 when the carrier ring 630 is resting on the carrier ring support 612. It will be appreciated that there may be zero, one, or more than one spacers 616 selected and positioned beneath the carrier ring support 612 to provide for the desired distance between the annular surface 610 and the carrier ring 630.

Additionally, the carrier ring support 612 and the spacer(s) 616 can be secured to the pedestal 600 by fastening hardware 614. In some implementations, the hardware 614 can include a screw, bolt, nail, pin, or other type of hardware suitable for securing the carrier ring support 612 and the spacer(s) 616 to the pedestal 600. In other implementations, other techniques/materials for securing the carrier ring support 612 and the spacer(s) 616 to the pedestal 600 can be utilized, such as a suitable adhesive.

Figure 6B:
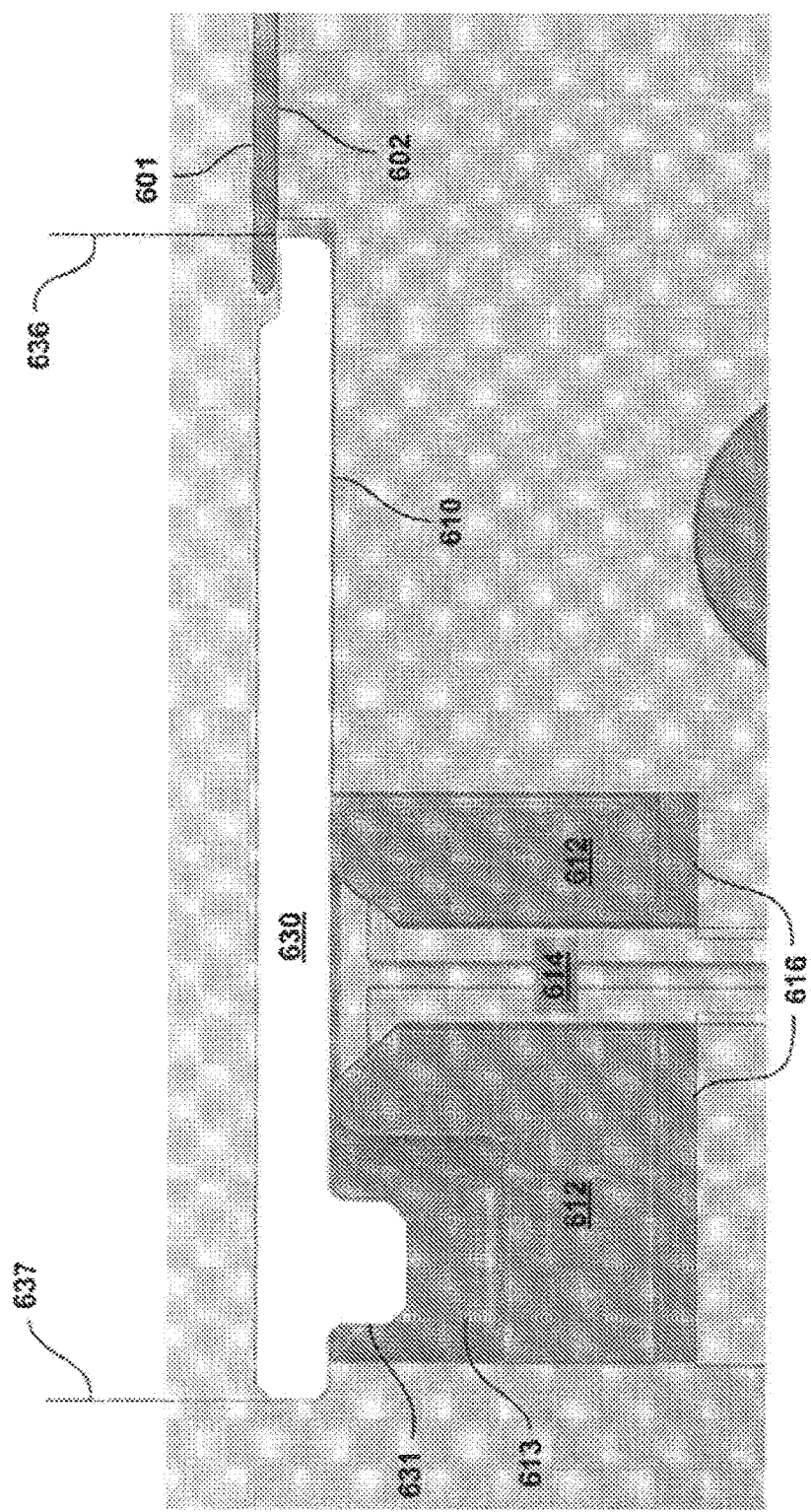
FIG. 6B shows a cross-section view of a portion of the example pedestal with the carrier ring of FIG. 6A.

FIG. 6B shows a cross-section view of a portion of the example pedestal with the carrier ring of FIG. 6A. The total height of the carrier ring support 612 can be defined by the combined height of the spacer 616 and the carrier ring support 612. This can also determine the extent to which the top surface of the carrier ring support 612 is higher than the annular surface 610 of the pedestal 600.

Figure 6C:
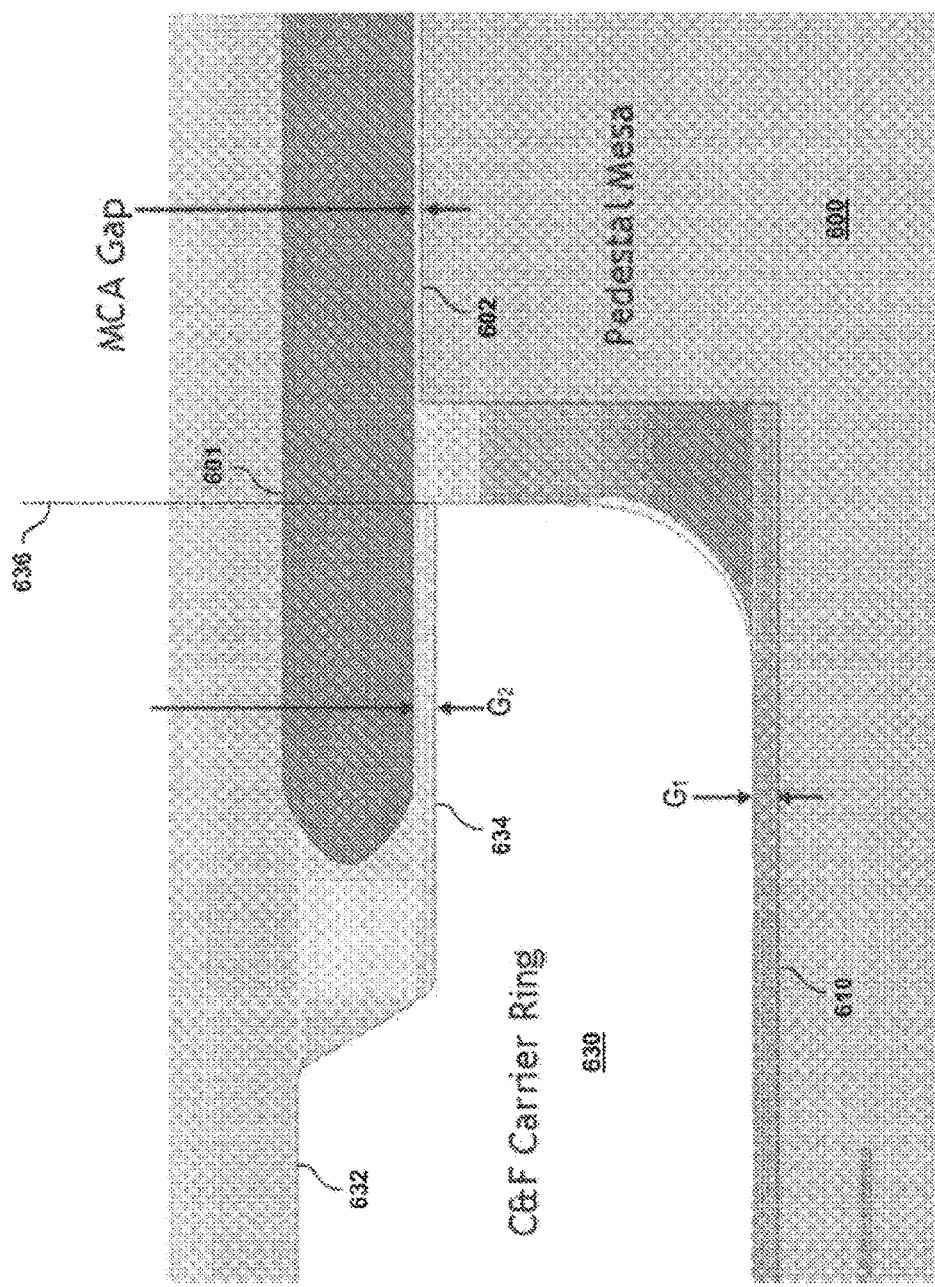
FIG. 6C shows a cross-section view of an outer edge of the example pedestal with the carrier ring and wafer of FIG. 6A.

FIG. 6C shows a cross-section view of an outer edge of the example pedestal with the carrier ring and wafer of FIG. 6A. One or more gaps can separate the wafer 601 from the carrier ring 630, and the carrier ring 630 from the annular surface 610. The one or more gaps can provide pathways for the transport of process gases (e.g., precursors, radical species, etc.) to the backside of the wafer 601. As illustrated in FIG. 6C, the carrier ring 630 includes an annular body having a top surface 632 and a step down surface 634. The top surface 632 and the step down surface 634 can be joined by a transition step. It will be appreciated that the step down surface 634 is defined proximate the inner diameter 636 of the carrier ring 630 and extends outwards from the inner diameter 636. The top surface 632 extends from the step down surface 634 to the outer diameter 637 (shown in FIG. 6B) of the carrier ring 630.

A lower gap G1 can exist between the bottom surface of the carrier ring 630 and the annular surface 610 of the pedestal 600. Additionally, an upper gap G2 can exist between a top surface of the carrier ring 630 and the backside of the wafer 601. It will be appreciated that each of the lower gap G1 and the upper gap G2 provide pathways for process gases to be transported to the backside of the wafer 601 during a deposition process. Therefore, controlling these gaps can minimize backside deposition as well.

The size of the lower gap G1 can be defined by the vertical separation between the annular surface 610 and the bottom surface of the carrier ring 630 when the carrier ring 630 is supported by the carrier ring support 612.

The size of the upper gap G2 between the wafer 601 and the carrier ring 630 can be defined by the vertical separation between the step down surface 634 and the backside of the wafer 601 when the wafer 601 is supported by one or more wafer supports above a wafer-facing surface 602. It will be appreciated that the size of the upper gap G2 can result from a variety of factors, including the size of the lower gap G1, the thickness of the carrier ring 630 in the region of the step down surface 634, the difference in vertical position between the annular surface 610 and the wafer-facing surface 602, and the distance above the wafer-facing surface 602 that the wafer 601 is maintained by the one or more wafer supports.

In some implementations, the lower gap G1 can be less than about 16 mil, such as between about 0 mil to 6 mil. In some implementations, the upper gap G2 can be less than about 10 mil, such as between about 0 mil to 5 mil. In some implementations, the upper gap G2 can be less than about 3 mil, or less than about 1 mil. Where the upper gap G2 is less than about 1 mil and even 0 mil, an edge seal can be formed to limit backside deposition.

Returning to FIGS. 1A and 1B, a system controller 110 can be configured with instructions for performing one or more operations of the apparatus, including operations to control the one or more wafer supports. Control of the one or more wafer supports can include control of the spatial arrangement and/or height of the one or more wafer supports, for example. The system controller 110 may also control other parameters for limiting backside deposition, such as the size of the gap between the bottom surface of a carrier ring and a pedestal and the size of the gap between an upper surface of a carrier ring and a wafer.

The system controller 110 provides electronic and interface controls required to operate the apparatus 100. The system controller 110 (which may include one or more physical or logical controllers) controls some or all of the properties of the apparatus 100. The system controller 110 typically includes one or more memory devices and one or more processors. The processor may include a central processing unit (CPU) or computer, analog and/or digital input/output connections, stepper motor controller boards, and other like components. Instructions for implementing appropriate control operations as described herein may be executed on the processor. These instructions may be stored on the memory devices associated with the system controller 110 or they may be provided over a network. In certain implementations, the system controller 110 executes system control software.

The system control software in the apparatus 100 may include instructions for controlling conditions in the processing chamber 102. This can include instructions for controlling pedestal temperature, lift pins, wafer supports, gas flows, chamber pressure, wafer position, wafer rotation, timing, carrier ring position, and other parameters performed by the apparatus 100. System control software may be configured in any suitable way. For example, various process tool component sub-routines or control objects may be written to control operation of the process tool components necessary to carry out various process tool processes. System control software may be coded in any suitable computer readable programming language.

In some implementations, system control software includes input/output control (IOC) sequencing instructions for controlling the various parameters described above. For example, each phase of positioning a wafer by positioning one or more wafer supports may include one or more instructions for execution by the system controller 110, each phase of controlling the gaps between the water and the pedestal as well as the water and the carrier ring may include one or more instructions for execution by the system controller 110, and each phase of deposition of film on the wafer may include one or more instructions for execution by the system controller 110. In some implementations, the phases of positioning the substrate and deposition may be sequentially arranged, so that all instructions for a process phase are executed concurrently with that process phase.

Other computer software and/or programs may be employed in some implementations. Examples of programs or sections of programs for this purpose include a wafer positioning program, a wafer support positioning program, a carrier ring positioning program, a pressure control program, a heater control program, and a potential/current power supply control program. Other examples of programs or sections of this program for this purpose include a timing control program, lift pins positioning program, a pedestal positioning program, a pedestal temperature control program, a showerhead temperature control program, a process gas control program, and a purge gas control program.

In a further embodiment, the wafer is supported on a chuck-less pedestal such that uniform gaps are maintained between the wafer edge and the pocket edge (for example, a ceramic focus ring). Reducing the variance in gaps provides better control of the deposited film thickness uniformity at the wafer edge.

Figure 7:
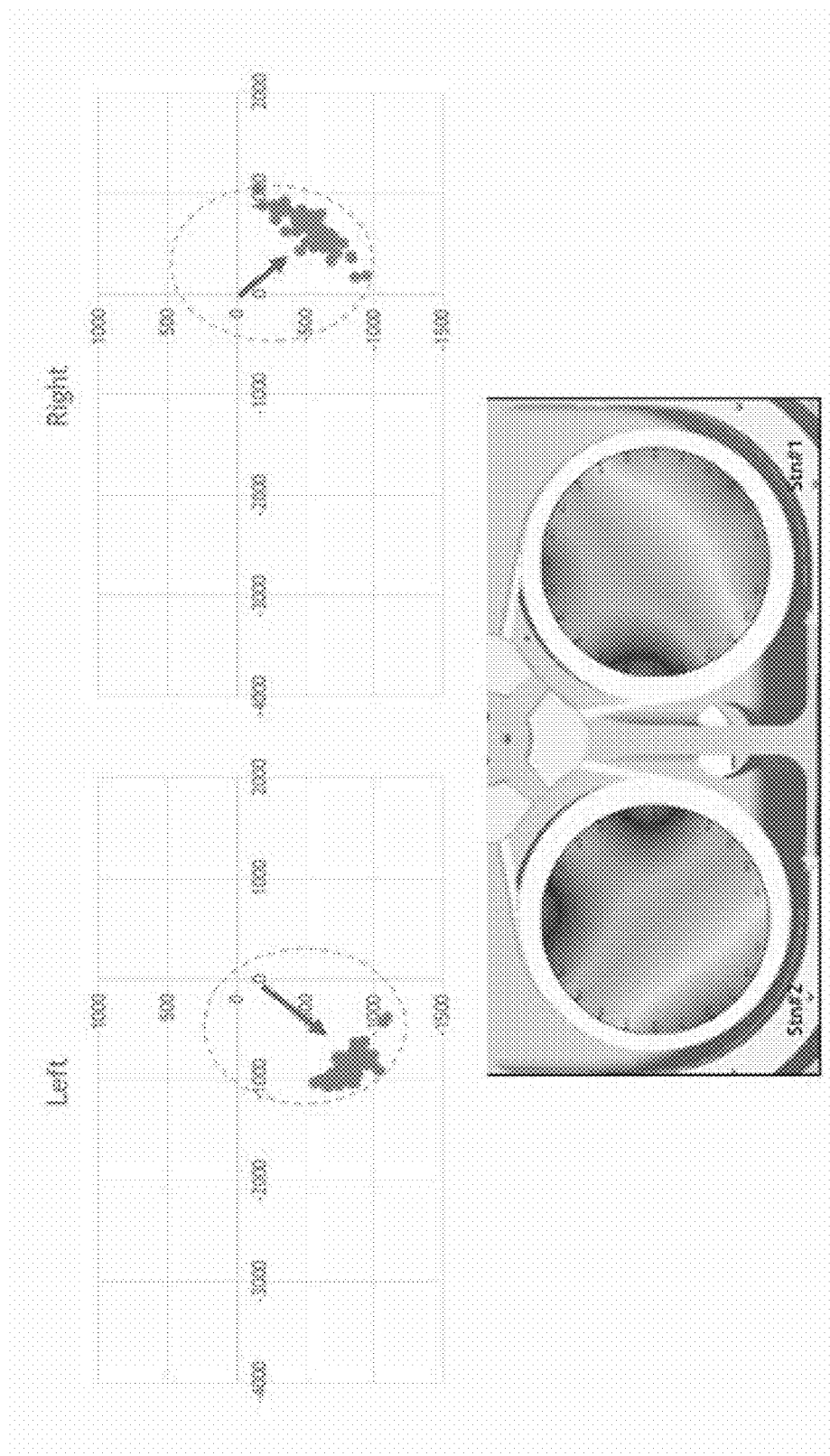
FIG. 7 shows a depiction of automatic wafer centering (AWC) data for a standard wafer transfer process for stations 1 and 2 of a four station deposition chamber wherein wafers are placed on chuck-less pedestals having minimum contact area (MCA) supports extending 2 mils above the substrate facing surface of the pedestal and the chamber pressure is at 0.5 Torr during the placement of the wafers on the wafer supports.

During deposition of a film on a wafer held in a chuck-less pedestal, water slippage can occur in an outward direction towards the chamber corner. For example, during standard wafer placement on the wafer supports having heights of 2 mils and at a chamber pressure of 0.5 Torr, slippage of the wafer center away from a center of the chuck-less pedestal during film deposition can exceed 500 microns. FIG. 7 depicts automatic wafer centering (AWC) data for a standard wafer placement wherein stations 1 and 2 of a four station deposition chamber are shown and AWC data for stations 1 and 2 show that wafer slippage can range from 500 to 1000 microns. In an oxide deposition chamber, a gas cushion can exist beneath the wafer and wafer slippage can result in wafer contact with the wall of the pedestal pocket at the wafer edge. The wafer slippage can be attributed to a "hockey pocking" effect due to gas beneath the wafer causing a reduction in friction and allowing movement of the wafer. Slippage on the order of 500 microns or more can result in a small or no gap on one edge of the wafer and a larger than desired gap on the opposite edge of the wafer. The variation in gap size can create variations in the way the plasma sheath develops at the wafer edge with consequent variation in thickness of the deposited film. For example, a variation in thickness on the order of 5 Angstroms can occur in an outer zone 1.5 mm from the wafer edge. Currently, it is desired to manufacture memory and logic device dies to the outer bevel of the wafer and variation in film thickness at the outer edge impacts yield and performance of the memory and logic devices. Although pedestals having wafer chucks could be used to resolve this issue, the addition of chucks increases the cost of the processing chambers and requires significant changes to the pedestals.

To minimize wafer slippage, various approaches can be used. In one implementation, gas can be pumped out while the wafer is in a pin-up configuration prior to lowering the wafer onto the pedestal. Optionally, gas can be flowed over the front side of the wafer to avoid particle contamination of the front side of the wafer due to the rapid pressure transition during pump down. In another implementation, the wafer can be supported on wafer supports which provide sufficient resistance/friction to hold the wafer by increasing the number of wafer supports and/or the material which contacts the backside of the wafer. In yet another implementation, gas conductance between the wafer and upper surface of the pedestal can be increased by increasing the height of the wafer supports to at least 4 mils.

In an embodiment, a method of reducing slippage of the wafer during film deposition on the wafer includes supporting the wafer above a wafer-facing surface of a chuck-less pedestal in a processing chamber, pumping out the processing chamber to a pressure effective to reduce slippage of the wafer when placed on wafer supports extending from the wafer-facing surface of the pedestal, lowering the wafer to an initial position on the wafer supports with a backside surface of the wafer located a sufficient distance above the wafer-facing surface of the chuck-less pedestal to reduce slippage during film deposition on the wafer, depositing a film on the wafer, and removing the wafer from the wafer supports, wherein when the wafer is removed from the wafer supports slippage of the wafer from its initial position is less than 400 microns.

Compared to a standard wafer placement operation wherein a wafer is lowered onto wafer supports extending 2 mils from the wafer-facing surface of the pedestal and the chamber pressure is 0.5 Torr while the wafer is lowered onto the wafer supports, in the low pressure wafer placement operation, the wafer supports can extend 4 mils from the wafer-facing surface and the chamber pressure can be less than 0.5 Torr, preferably 0.1 Torr or lower. The following Table provides a comparison of film thickness uniformity and wafer slippage wherein "MCAs" denotes minimum contact area pins, NU % denotes % nonumiformity determined by measuring maximum film thickness (Tmax) and minimum film thickness (Tmin) measured over 73 points collected in polar pattern up to 1.8 min from the wafer's edge with NU %=(Tmax−Tmin)/2.

| Transfer Mode | MCAs | NU % | Wafer Slippage |
| --- | --- | --- | --- |
| Standard Pressure | 2 mil | 0.9 | >500 μm (3 out or 4 stations) |
| Low Pressure | 4 mil | 0.5 (4 station average) | <200 μm (4 stations) |

During a film deposition process, four wafers can be processed with or without moving the wafers from station to station. For example, in a film deposition process wherein the wafers are moved from station to station and films are deposited sequentially at each station, wafer placement can take place as follows in a four station chamber having four pedestals with four carrier rings and two loading ports: (1) two processed wafers are removed from stations 1 and 2 and two wafers (wafers 1 and 2) can be simultaneously transferred into the chamber and loaded onto lift pins of the pedestals at stations 1 and 2, (2) the two wafers can be lowered onto wafer supports of the pedestals at stations 1 and 2, (3) spider forks can simultaneously lift the four carrier rings at stations 1-4 and rotate them 180° to move wafers 1 and 2 to stations 3 and 4, (4) two additional wafers (wafers 3 and 4) can be simultaneously transferred into the chamber and loaded onto the lift pins of the pedestals at stations 1 and 2, (5) wafers 3 and 4 can be lowered onto the wafer supports at stations 1 and 2 while wafers 1 and 2 are lowered onto the wafer supports of the pedestals at stations 3 and 4. Film deposition can be carried out sequentially by depositing a portion of the film at each station. At the end of the deposition process, the processed wafers are indexed to return wafers 1 and 2 to stations 1 and 2 so that they can remain in the same order they were when inserted into the chamber. New wafers 1 and 2 are exchanged with processed wafers 1 and 2, new wafers 1 and 2 are indexed 180°, new wafers 3 and 4 are exchanged with processed wafers 3 and 4, and the film deposition process is repeated with the new wafers sequentially in four steps by carrying out part of the film deposition at each station. In sequential deposition, the low pressure transfer is carried out each time the wafers are indexed to the next station. Thus, compared to standard wafer placement without pump down during wafer placement, the low pressure wafer placement process reduces wafer throughput due to the extra time needed to carry out the pumping down step.

Figure 8A:
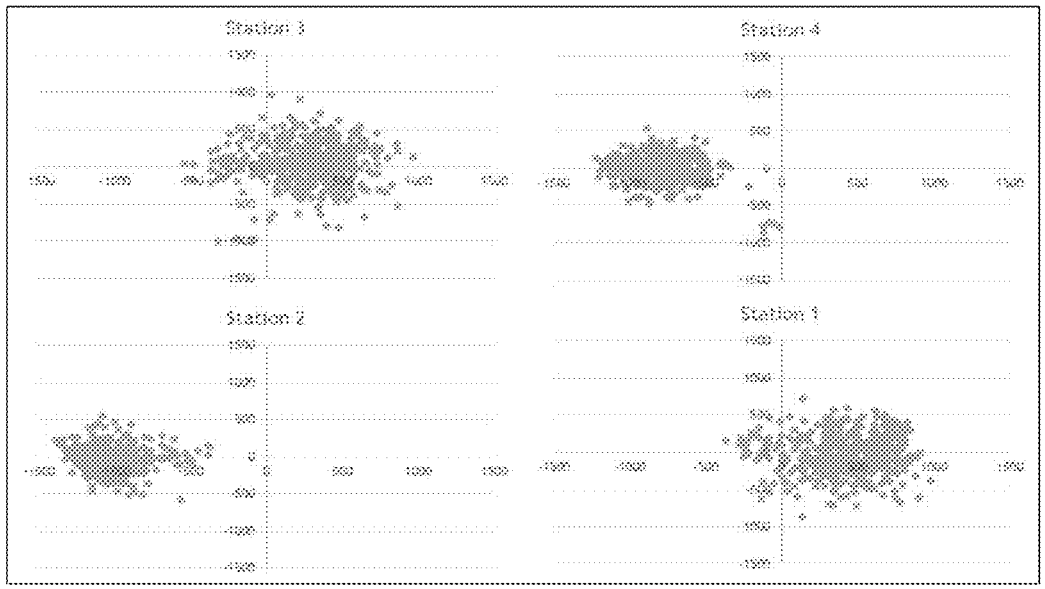
Figure 8B:
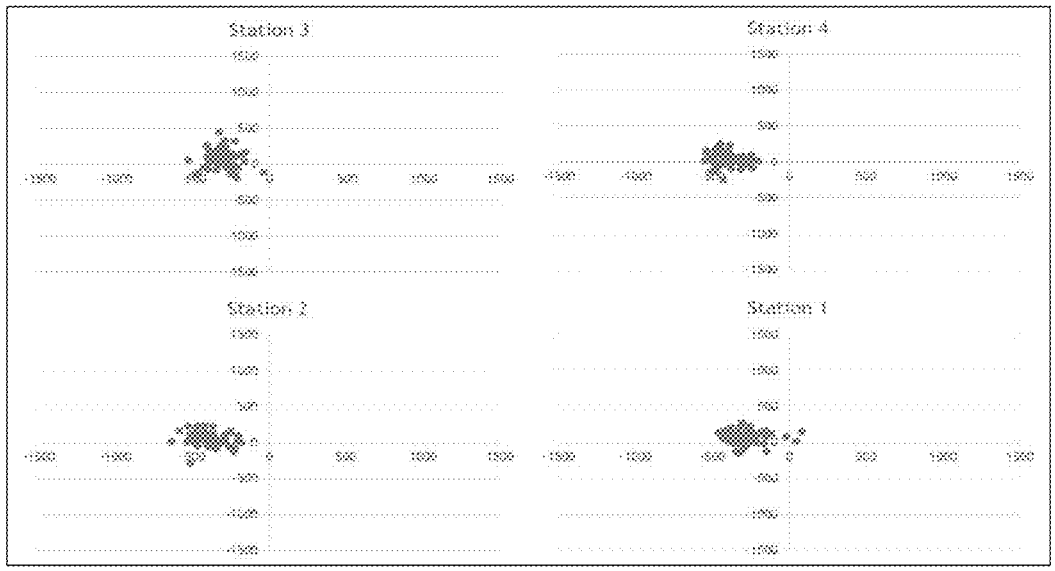

FIGS. 8A-8B show depictions of AWC data comparing two wafer placement processes for stations 1-4 of a four station deposition chamber. Figure SA shows data for a standard wafer placement process in which the wafers are lowered onto a chuck-less pedestal having MCAs with heights of 2 mils and chamber pressure is at 0.5 Torr. The data in FIG. 8A shows that wafers slip radially outward various distances averaging over 500 microns during film deposition. FIG. 8B shows data for a low pressure wafer placement process in which the wafers are lowered onto MCAs having a height of 4 mils and the pump-to-base chamber pressure of <0.01 Torr. The AWC data in FIG. 8B shows that average wafer slippage is reduced to below 200 microns. However, robot error and thermal expansion between calibration and process result in possible offsets of up to 200 microns from 0 (center). Thus, AWC data below 200 microns indicates that the wafer is likely centered with no slippage.

Figure 9:
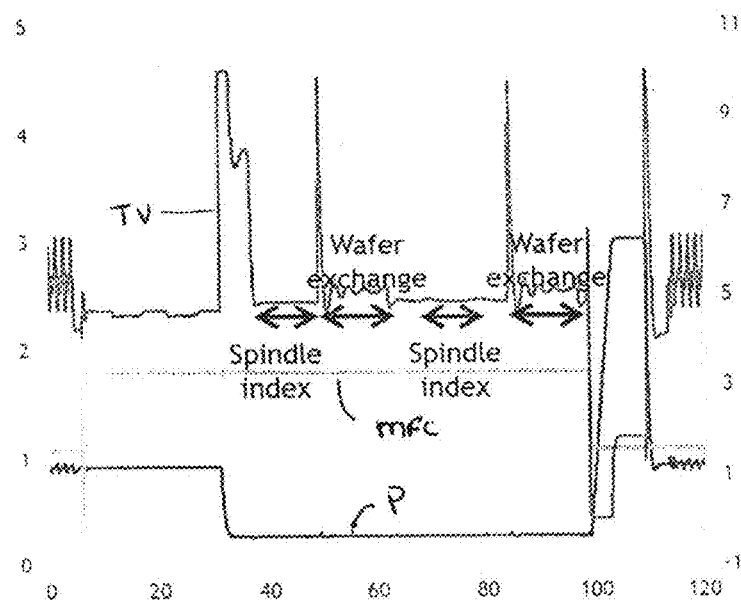
FIG. 9 shows a graph of chamber pressure (P), gas flow (WC) and throttle valve position (TV) for the standard wafer placement.

FIG. 9 illustrates a standard wafer placement process for a four station chamber with two loading ports wherein during transfer of wafers 1 and 2 the initial chamber pressure is at 0.5 Torr, wafers 1 and 2 are lowered onto the wafer supports of the pedestals at stations 1 and 2, the carrier rings at stations 1-4 are raised and rotated (spindle index) to move wafers 1 and 2 to stations 3 and 4, the carrier rings are lowered onto the pedestals at stations 1-4, wafers 3 and 4 are transferred into the chamber and lowered onto the lift pins at stations 1 and 2, the lift pins are lowered to place wafers 1 and 2 onto the wafer supports at stations 1 and 2, and film deposition is carried out.

Figure 10:
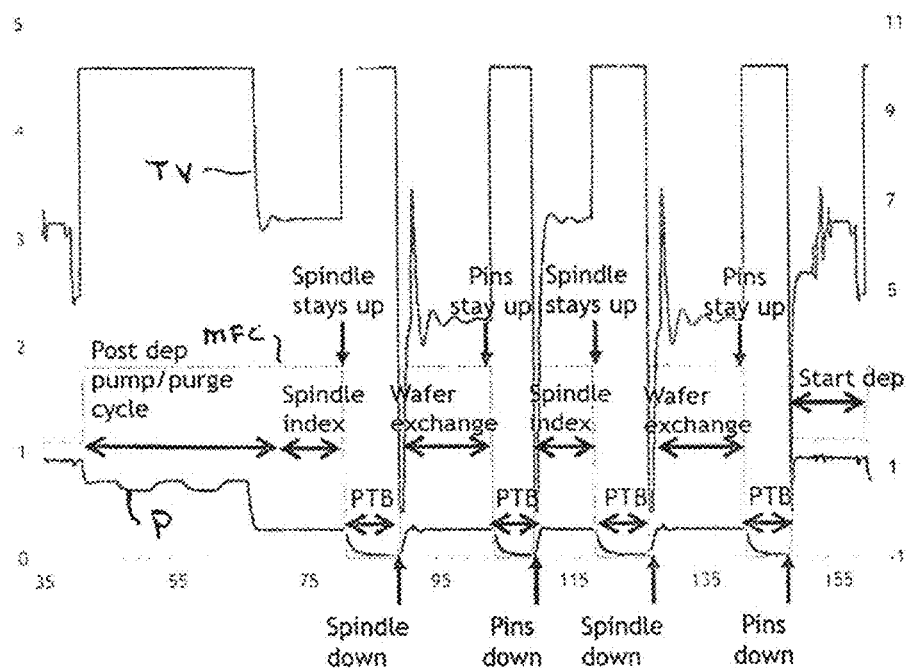
FIG. 10 shows a graph of chamber pressure (P), gas flow (MFC) and throttle valve position (TV) for the low pressure wafer placement.

FIG. 10 illustrates a low pressure wafer placement process for a four station chamber with two loading ports wherein wafers 1 and 2 are transferred into the chamber while the initial chamber pressure is at 0.5 Torr, wafers 1 and 2 are lowered onto lift pins of the pedestals at stations 1 and 2, pressure in the chamber is lowered to 0.1 Torr or below, wafers 1 and 2 are lowered onto the wafer supports of the pedestals at stations 1 and 2, pressure in the chamber is raised to 0.5 Torr, the carrier rings at stations 1-4 are raised and rotated (spindle index) to move wafers 1 and 2 to stations 3 and 4, the carrier rings are lowered onto the pedestals at stations 1-4, wafers 3 and 4 are transferred into the chamber and lowered onto the lift pins at stations 1 and 2, chamber pressure is reduced to 0.1 Torr or below, the lift pins are lowered to place wafers 3 and 4 onto the wafer supports at stations 1 and 2 while the carrier rings at stations 3 and 4 lower wafers 1 and 2 onto the wafer supports at stations 3 and 4, and film deposition is carried out.

The transfer process can be carried out with an empty chamber or when wafers are exchanged after a film deposition process. During film deposition, the wafers can remain at the same station for the entire deposition process. Alternatively, part of the film deposition can be carried out at each station which requires water transfer from station to station. To minimize wafer slippage during the film deposition process, the wafers are placed on the wafer supports using the low pressure process described above.

During a film deposition process wherein wafers are processed sequentially at four stations, wafers can be exchanged two at a time into and out of the chamber. FIG. 10 is a graph showing four pump-to-base steps which occur during water placement. Assuming film deposition occurs with wafer 1 at station 3 and the wafers are indexed four times such that wafer 1 ends at station 2, the transfer process is as follows. In step 1, with 4 processed wafers (PW1, PW2, PW3, PW4) arranged with PW1 at station 2 (S2), PW2 at station 3 (S3), PW3 at station 4 (S4) and PW4 at station 1 (S1), to maintain the wafers in the desired order, the spindle is indexed to bring PW1 and PW2 back to S1 and S2 so that they can be removed from the chamber first. In step 2, a first pump to base (PB1) is carried out to lower chamber pressure below 0.5 Torr, preferably below 0.1 Torr such as to below 0.01 Torr. In step 3, while the chamber is at PB1, the spindle is lowered to drop the processed wafers (PW1, PW2, PW3, PW4) on carrier rings (CR1, CR2, CR3, CR4) such that PW1 is lowered onto wafer supports at S1, PW2 is lowered onto wafer supports at S2, PW3 is lowered onto wafer supports at S3 and PW4 is lowered onto wafer supports at S4. In step 4, the lift pins at S1 and S2 are raised to lift the processed wafers (PW1 and PW2) at S1 and S2. In step 5, end effectors remove PW1 and PW2 from the chamber at S1 and S2. In step 6, the lift pins at S1 and S2 are lowered. In step 7, end effectors transfer new wafers (W1 and W2) into the chamber. In step 8, the lift pins at S1 and S2 are raised to remove W1 and W2 from the end effectors. In step 9, the end effectors are removed from the chamber. In step 10, a second pump to base (PB2) is carried out to lower chamber pressure to below 0.5 Torr, preferably below 0.1 Torr such as 0.01 Torr or below. In step 11, while the chamber is at PB2, the lift pins at S1 and S2 are lowered to place W1 and W2 on wafer supports at S1 and S2. In step 12, the spindle is raised to lift the carrier rings (CR1, CR2, CR3, CR4) along with wafers (W1, W2, PW3, PW4). In step 13, the spindle is indexed (rotated) to move processed wafers (PW3 and PW4) on carrier rings (CR3 and CR4) from S3 and S4 to S1 and S2 and move CR1/W1 and CR2/W2 to S3 and S4. In step 14, with the spindle up, a third pump to base (PB3) is carried out to lower chamber pressure to below 0.5 Torr, preferably to below 0.1 Torr such as below 0.01 Torr. In step 15, the spindle is lowered to place wafers (W1, W2, PW3, PW4) on wafer supports at S3, S4, S1 and S2. In step 16, lift pins at S1 and S2 lift PW3 and PW4. In step 17, end effectors remove PW3 and PW4 from lift pins at S1 and S2 and transfer PW3 and PW4 out of the chamber. In step 18, end effectors transfer new wafers (W3 and W4) into the chamber. In step 19, lift pins at S1 and S2 are raised to remove W3 and W4 from end effectors. In step 20, the end effectors are withdrawn from chamber. In step 21, with the lift pins up at S1 and S2, a fourth pump to base (PB4) is carried out to lower chamber pressure to below 0.5 Torr, preferably to below 0.1 Torr such as below 0.01 Torr. In step 22, with the chamber at PB4, the lift pins at S1 and S2 are lowered to place W3 and W4 on wafer supports at S1 and S2. Subsequently, film deposition is carried out by depositing film material on the wafers with all of the film being deposited while the waters remain in one station or depositing the film sequentially by depositing a portion of the film at each station. Sequential deposition has the advantage of increasing overall film uniformity due to the effect of having each wafer processed at all four stations in which case wafer placement is more precise due to the low pressure placement as the wafers are transferred to each successive station.

In sequential film deposition, the four wafers (W1, W2, W3, W4) are moved from station to station in the four stations (S1, S2, S3, S4) as follows. After a first deposition step in which a portion of the desired film thickness is deposited on the wafers, the wafers are indexed by raising the spindle to lift the four carrier rings (CR1, CR2, CR3, CR4) along with wafers (W1, W2, W3, W4), the spindle rotates 90°, chamber pressure is lowered to below 0.5 Torr, preferably to below 0.1 Torr such as below 0.01 Torr, at the lowered chamber pressure the spindle is lowered to place the wafers on the wafer supports at the four stations with W1 at S2, W2 at S3, W3 at S4 and W4 at S1, and a second deposition step is carried out to deposit a portion of the overall thickness desired. After the second deposition step, the four wafers are raised when the spindle lifts the four carrier rings, the spindle rotates 90°, chamber pressure is lowered to below 0.5 Torr, preferably to below 0.1 Torr such as below 0.01 Torr, at the lowered pressure the spindle is lowered to place the wafers on the wafer supports at the four stations with W1 at S3, W2 at S4, W3 at S1 and W4 at S2, and a third film deposition step is carried out to deposit a portion of the overall thickness desired. After the third deposition step, the four wafers are raised when the spindle lifts the four carrier rings, the spindle rotates 90°, chamber pressure is lowered to below 0.5 Torr, preferably to below 0.1 Torr such as below 0.01 Torr, at the lowered pressure the spindle is lowered to place the wafers on the water supports at the four stations with W1 at S3, W2 at S4, W3 at S1, and W4 at S2, and a fourth film deposition is carried out to deposit the film to the desired thickness. After the fourth deposition step, the processed wafers are removed from the chamber and new wafers are loaded into the chamber as discussed above.

Although the foregoing has been described in some detail for purposes of clarity and understanding, it will be apparent that certain changes and modifications may be practiced within the scope of the appended claims. It should be noted that there are many alternative ways of implementing the processes, systems, and apparatus described. Accordingly, the described embodiments are to be considered as illustrative and not restrictive.

What is claimed is:

1. A method of reducing wafer slippage during deposition of a film on the wafer, the method comprising:
   supporting the wafer on lift pins or on a carrier ring such that the wafer is above wafer supports on a wafer-facing surface of a chuck-less pedestal in a processing chamber with a gap between an outer edge of the wafer and a wall of a pocket;

while supporting the wafer on the lift pins or carrier ring with the wafer above the wafer supports, pumping out the processing chamber to a reduced pressure effective to reduce slippage of the wafer when placed on wafer supports extending from the wafer-facing surface of the pedestal;

lowering the lift pins or carrier ring such that the wafer is lowered onto the wafer supports while the processing chamber is at the reduced pressure and supporting the wafer a sufficient distance above the wafer-facing surface of the chuck-less pedestal to reduce lateral slippage in the pocket during film deposition on the wafer;

depositing a film on the wafer while supported on the wafer supports, wherein slippage of the wafer off center from its initial position is less than 400 microns after the film is deposited.

2. The method of claim 1, wherein slippage of the wafer off center from its initial position is less than 200 microns after the film is deposited.

3. The method of claim 1, wherein the reduced pressure is below 0.5 Torr.

4. A method of reducing wafer slippage during deposition of a film on the wafer, the method comprising:

supporting the wafer above a wafer-facing surface of a chuck-less pedestal in a processing chamber;

pumping out the processing chamber to a reduced pressure effective to reduce slippage of the wafer when placed on wafer supports extending from the wafer-facing surface of the pedestal;

lowering the wafer onto the wafer supports while the processing chamber is at the reduced pressure and supporting the wafer a sufficient distance above the wafer-facing surface of the chuck-less pedestal to reduce slippage during film deposition on the wafer;

depositing a film on the wafer while supported on the wafer supports, wherein slippage of the wafer off center from its initial position is less than 400 microns after the film is deposited;

wherein the processing chamber includes at least first, second, third and fourth stations, the first station having a first chuck-less pedestal and a first carrier ring at an outer periphery thereof supporting a first wafer, the second station having a second chuck-less pedestal and a second carrier ring at an outer periphery thereof supporting a second wafer, the third station having a third chuck-less pedestal and third carrier ring at an outer periphery thereof, and the fourth station having a fourth chuck-less pedestal and carrier ring at an outer periphery thereof, the method further comprising simultaneously lifting the first, second, third and fourth carrier rings at the first, second, third and fourth stations, indexing the first, second, third and fourth carrier rings such that the first and second wafers on the first and second carrier rings are moved to the third and fourth stations, pumping out the processing chamber to a pressure effective to reduce slippage of the first and second wafers when placed on wafer supports extending from wafer-facing surfaces of the third and fourth chuck-less pedestals, lowering the first and second wafers onto the wafer supports of the third and fourth chuck-less pedestals while the processing chamber is at the reduced pressure.

5. The method of claim 4, further comprising transferring third and fourth wafers into the processing chamber at the first and second stations, supporting the third and fourth wafers on raised lift pins at the first and second stations, pumping out the processing chamber to a pressure effective to reduce slippage of the third and fourth wafers when placed on the wafer supports at the first and second stations, lowering the lift pins at the first and second stations so as to support the third and fourth wafers on the wafer supports of the first and second chuck-less pedestals while the processing chamber is at the reduced pressure.

6. The method of claim 1, wherein the wafer supports comprise at least three minimum contact area (MCA) support members.

7. The method of claim 1, wherein the wafer supports extend at least 2 mils above the wafer-facing surface.

8. The method of claim 1, wherein the wafer supports extend at least 4 mils above the wafer-facing surface.

9. The method of claim 1, wherein the wafer supports extend at least 6 mils above the wafer-facing surface.

10. The method of claim 1, further comprising flowing gas onto a frontside of the wafer while pressure in the processing chamber is lowered to the reduced pressure.

11. The method of claim 1, wherein the wafer is supported on lift pins while the pressure in the processing chamber is lowered to the reduced pressure.

12. The method of claim 11, wherein the wafer is lowered onto the wafer supports by lowering the lift pins while maintaining the processing chamber at the reduced pressure.

13. The method of claim 1, wherein the wafer is supported on a carrier ring while the pressure in the processing chamber is lowered to the reduced pressure.

14. The method of claim 1, wherein the reduced pressure is 0.2 Torr or below.

15. The method of claim 1, wherein the reduced pressure is 0.05 Torr or below.

16. The method of claim 1, wherein the film deposition comprises atomic layer deposition (ALD) on a frontside of the wafer.

17. The method of claim 16, wherein film thickness variation at a distance of 1.5 mm from an outer edge of the wafer is below 5 Angstroms.

18. The method of claim 16, wherein the film deposition is carried out in a single processing station of the processing chamber.

19. The method of claim 16, wherein the film deposition is carried out sequentially in four stations of the processing chamber.

* * * * *